(12) United States Patent
Chen

(10) Patent No.: US 11,314,003 B2
(45) Date of Patent: Apr. 26, 2022

(54) SPECIAL-SHAPED DISPLAY SCREEN AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Jiangchuan Chen, Shenzhen (CN)

( * ) Notice: Subject to any disclaimer, the term of this patent is extended or adjusted under 35 U.S.C. 154(b) by 259 days.

(21) Appl. No.: 16/625,793

(22) PCT Filed: Dec. 16, 2019

(86) PCT No.: PCT/CN2019/125647
§ 371 (c)(1),
(2) Date: Dec. 23, 2019

(87) PCT Pub. No.: WO2021/109228
PCT Pub. Date: Jun. 10, 2021

(65) Prior Publication Data
US 2021/0356637 A1    Nov. 18, 2021

(30) Foreign Application Priority Data

Dec. 6, 2019   (CN) .......................... 201911241255.6

(51) Int. Cl.
*G02B 5/20* (2006.01)
(52) U.S. Cl.
CPC .................... *G02B 5/201* (2013.01)
(58) Field of Classification Search
CPC . G02B 5/201; G02F 1/133514; G02F 1/1335; G02F 2201/52

USPC .......................................................... 359/891
See application file for complete search history.

(56) References Cited

U.S. PATENT DOCUMENTS

| | | | | |
|---|---|---|---|---|
| 2010/0289994 | A1* | 11/2010 | Nonaka ................. | G02F 1/1368 349/108 |
| 2014/0204008 | A1* | 7/2014 | Chu-Ke ............... | G09G 3/2003 345/88 |
| 2015/0076473 | A1* | 3/2015 | Miyake ............... | H01L 27/3216 257/40 |
| 2016/0300520 | A1* | 10/2016 | Wang ....................... | G09F 9/30 |
| 2019/0164996 | A1 | 5/2019 | Wang et al. | |

(Continued)

FOREIGN PATENT DOCUMENTS

| | | |
|---|---|---|
| CN | 104299523 A | 1/2015 |
| CN | 104933981 A | 9/2015 |
| CN | 205318767 U | 6/2016 |

(Continued)

*Primary Examiner* — Jade R Chwasz

(57) ABSTRACT

A special-shaped display screen and a display device are provided. The special-shaped display screen includes a first display area and a second display area. The first display area includes a first boundary and a first pixel area, and the first boundary is disposed on an outer periphery of the first pixel area. The second display area includes a second boundary and a second pixel area, and the second boundary and the first boundary define an effective display area of the special-shaped display screen. The first pixel area is formed by a plurality of triangular pixel units, and the second pixel area is spliced by a plurality of rectangular pixel units arranged alternately in a face-up configuration and a face-down configuration.

14 Claims, 2 Drawing Sheets

(56) References Cited

U.S. PATENT DOCUMENTS

2019/0235334 A1 8/2019 Wu et al.
2020/0273925 A1 8/2020 Zhixiang et al.

FOREIGN PATENT DOCUMENTS

| CN | 106023820 A | 10/2016 |
| CN | 107170364 A | 9/2017 |
| CN | 107219677 A | 9/2017 |
| CN | 108364567 A | 8/2018 |
| CN | 108962034 A | 12/2018 |
| CN | 209657684 U | 11/2019 |
| KR | 20180084860 A | 7/2018 |

\* cited by examiner

SPECIAL-SHAPED DISPLAY SCREEN AND DISPLAY DEVICE

FIELD OF INVENTION

The present disclosure relates to the field of display technologies, and more particularly, to a special-shaped display screen and a display device.

BACKGROUND OF INVENTION

With improvement of people's living standards and development of technology, display screens have become an indispensable part of life, have departed from square structures in people's impression for a long time, and are becoming diversity.

In current special-shaped display screen designs, a position in a special-shaped area easily has a jagged problem caused by pixels shielding because in the special-shaped area, all pixels in a display area are conventional RGB rectangular structures, and this phenomenon is more significant for products having lower resolution.

Therefore, it is necessary to provide a new special-shaped display screen design to solve the problem of jagged edges in a special-shaped display screen, thereby improving display quality.

Technical problem: in current special-shaped display screen design, a position in a special-shaped area easily has a jagged problem caused by pixels shielding because in the special-shaped area, all pixels in a display area are conventional RGB rectangular structures, and this phenomenon is more significant for products having lower resolution.

SUMMARY OF INVENTION

To solve the above technical problem, an objective of the present disclosure is to provide a special-shaped display screen and a display device by disposing sub-pixels having different shapes in a first display area and a second display area to solve the problem of jagged edges.

To achieve the above objective, an embodiment of the present disclosure provides a special-shaped display screen. The special-shaped display screen comprises a first display area including a first boundary and a first pixel area, wherein the first boundary is disposed on an outer periphery of the first pixel area; and a second display area including a second boundary and a second pixel area, wherein the second boundary and the first boundary define an effective display area of the special-shaped display screen, wherein the first pixel area is formed by splicing a plurality of triangular pixel units arranged alternately in a face-up configuration and a face-down configuration; the second pixel area is formed by splicing a plurality of rectangular pixel units arranged alternately in a face-up configuration and a face-down configuration.

In an embodiment of the present disclosure, wherein any one of the triangular pixel units comprises a first color triangular sub-pixel unit, a second color triangular sub-pixel unit, a third color triangular sub-pixel unit, and a fourth color triangular sub-pixel unit, and the triangular sub-pixel units are spliced to form the any one of the triangular pixel units.

In an embodiment of the present disclosure, wherein the first color triangular sub-pixel unit, the second color triangular sub-pixel unit, the third color triangular sub-pixel unit, and the fourth color triangular sub-pixel unit have a same size, and the second color triangular sub-pixel unit is disposed in a face-down configuration.

In an embodiment of the present disclosure, wherein the second color triangular sub-pixel unit and the fourth color triangular sub-pixel unit have a same luminescent color, and are blue triangular sub-pixel units, and the first color triangular sub-pixel unit and the third color triangular sub-pixel unit are respectively a red triangular sub-pixel unit and a green triangular sub-pixel unit.

In an embodiment of the present disclosure, wherein the rectangular pixel units comprise a first color rectangular sub-pixel unit, a second color rectangular sub-pixel unit, a third color rectangular sub-pixel unit, and a fourth color rectangular sub-pixel unit, and the rectangular sub-pixel units are spliced to form any one of the rectangular pixel units.

In an embodiment of the present disclosure, wherein the first color rectangular sub-pixel unit, the second color rectangular sub-pixel unit, the third color rectangular sub-pixel unit, and the fourth color rectangular sub-pixel unit have a same size.

In an embodiment of the present disclosure, wherein the second color rectangular sub-pixel unit and the fourth color rectangular sub-pixel unit have a same luminescent color, and are blue rectangular sub-pixel units, and the first color rectangular sub-pixel unit and the third color rectangular sub-pixel unit are respectively a red rectangular sub-pixel unit and a green rectangular sub-pixel unit.

In an embodiment of the present disclosure, wherein a long side of the second color rectangular sub-pixel unit is disposed adjacent to short sides of the first color rectangular sub-pixel unit, the third color rectangular sub-pixel unit, and the fourth color rectangular sub-pixel unit.

In an embodiment of the present disclosure, wherein a luminescent color of the fourth color triangular sub-pixel unit or the fourth color rectangular sub-pixel unit is white.

To achieve the above objective, an embodiment of the present disclosure further provides a display device. The display device comprises the above special-shaped display screen.

Beneficial effect: the present disclosure provides a special-shaped display screen and a display device by disposing sub-pixels having different shapes in a first display area and a second display area to solve the problem of jagged edges, thereby improving display quality.

DETAILED DESCRIPTION OF PREFERRED EMBODIMENTS

Figure 1:
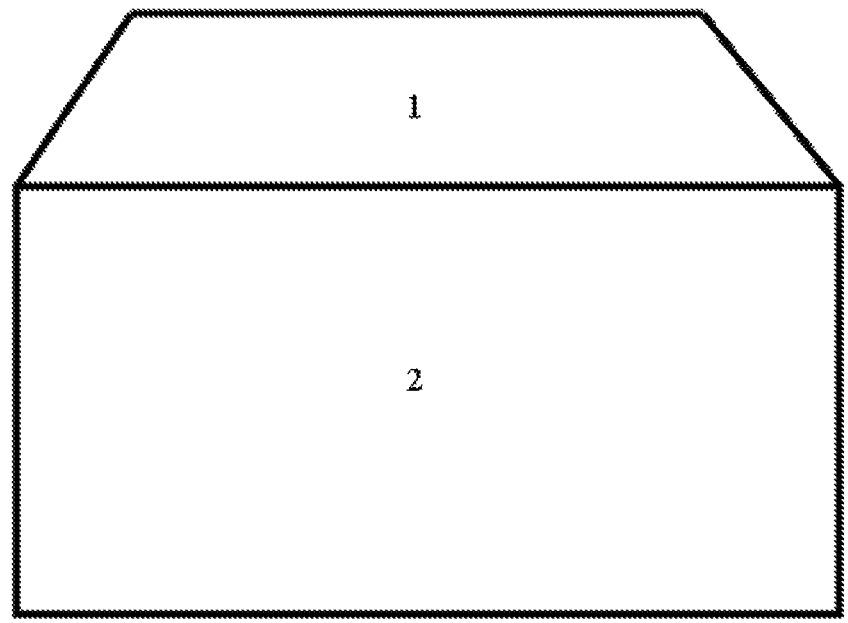
FIG. 1 is a schematic diagram of a special-shaped display screen according to an embodiment of the present disclosure.

The preferred embodiments of the present disclosure are described in detail below with reference to the accompanying drawings. The specific embodiments described with reference to the attached drawings are all exemplary and are intended to illustrate and interpret the present disclosure to make the skilled in the art easier to understand how to implement the present disclosure. The disclosure herein provides many different embodiments or examples for realizing different structures of the present disclosure. They are only examples and are not intended to limit the present disclosure.

In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure.

In the accompanying drawings, wherein the identical or similar reference numerals constantly denote the identical or similar elements or elements having the identical or similar functions. In the drawings, structurally identical components are denoted by the same reference numerals, and structural or functionally similar components are denoted by like reference numerals. Moreover, a size and a thickness of each component shown in the drawings are arbitrarily shown for ease of understanding and description, and the present disclosure does not limit the size and thickness of each component.

FIG. 1 is a schematic diagram of a special-shaped display screen according to an embodiment of the present disclosure. As shown in FIG. 1, an embodiment of the present disclosure provides a special-shaped display screen, such as a notch screen or a water drop screen. The special-shaped display screen can be used in organic light-emitting diode (OLED) displays or liquid crystal displays. The present disclosure takes a notch screen for example, but it is not limited to this.

Figure 2:
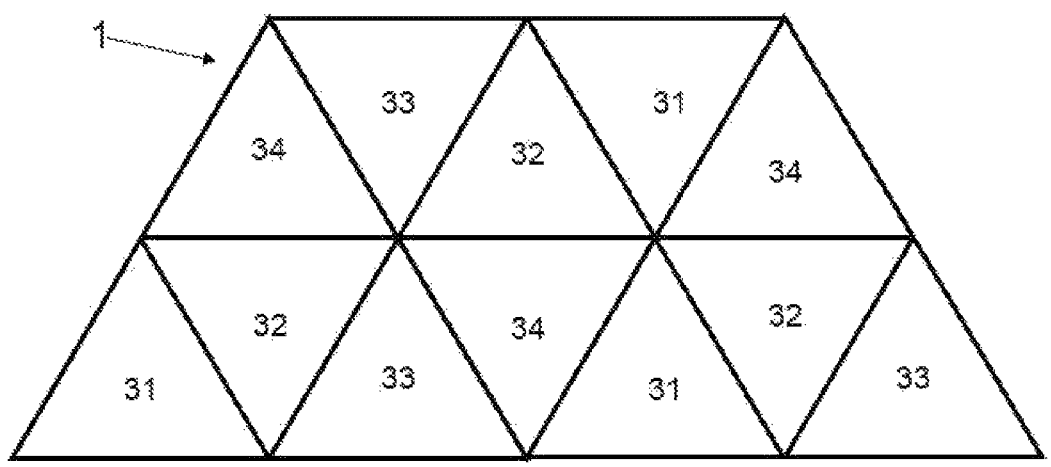
FIG. 2 is a schematic diagram of a pixel unit arrangement in a first display area according to an embodiment of the present disclosure.
Figure 3:
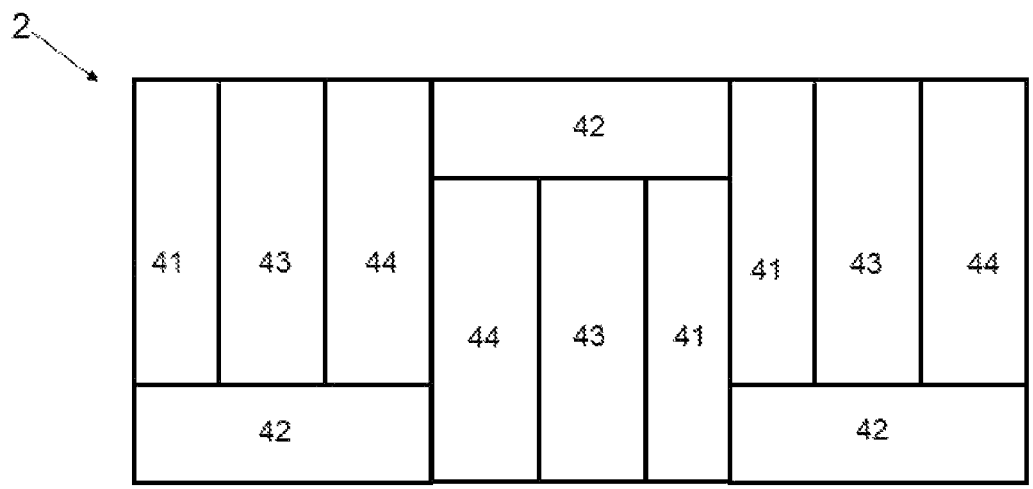
FIG. 3 is a schematic diagram of a pixel unit arrangement in a second display area according to an embodiment of the present disclosure.
Figure 4:
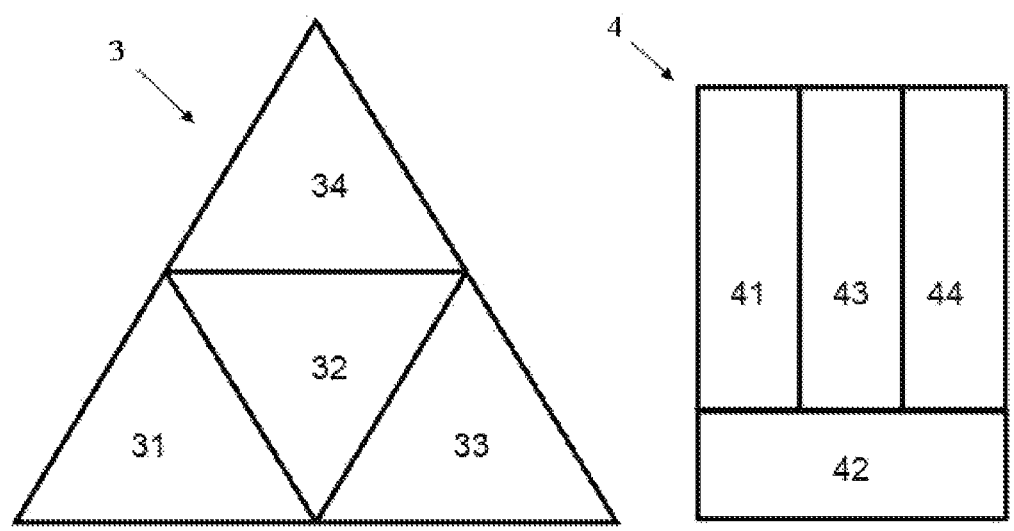
FIG. 4 is a schematic diagram of sub-pixel unit arrangements of a triangular pixel unit and a rectangular pixel unit according to an embodiment of the present disclosure.

FIG. 2 is a schematic diagram of a pixel unit arrangement in a first display area according to an embodiment of the present disclosure. FIG. 3 is a schematic diagram of a pixel unit arrangement in a second display area according to an embodiment of the present disclosure. FIG. 4 is a schematic diagram of sub-pixel unit arrangements of a triangular pixel unit and a rectangular pixel unit according to an embodiment of the present disclosure.

Combining FIG. 2 to FIG. 4 for description, in an embodiment of the present disclosure, the special-shaped display screen comprises a first display area 1 and a second display area 2. The first display area 1 includes a first boundary and a first pixel area, wherein the first boundary is disposed on an outer periphery of the first pixel area. The second display area 2 includes a second boundary and a second pixel area, wherein the second boundary and the first boundary define an effective display area of the special-shaped display screen. Wherein, the first display area 1 and the second display area 2 are respectively a special-shaped display area and a conventional display area.

Specifically, the first boundary is defined by outer peripheral edges of the first pixel area, and any two sides of the outer peripheral edges of the first pixel area form an angle other than 90 degrees; the second boundary is defined by outer peripheral edges of the second pixel area, and any two sides of the outer peripheral edges of the second pixel area form an angle of 90 degrees. In addition, a region formed by the second boundary and the first boundary defines the effective display area of the special-shaped display screen.

Wherein, the first boundary and the second boundary are respectively a special-shaped boundary and a conventional boundary.

Specifically, as shown in FIG. 2, the first pixel area is formed by splicing a plurality of triangular pixel units 3 arranged alternately in a face-up configuration and a face-down configuration, thereby forming the first display area 1 which includes the first boundary and has a shape consistent with a notch screen. The second pixel area is formed by a plurality of rectangular pixel units 4, and further forms the second display area 2.

As shown in FIG. 4, in an embodiment of the present disclosure, any one of the triangular pixel units 3 comprises a first color triangular sub-pixel unit 31, a second color triangular sub-pixel unit 32, a third color triangular sub-pixel unit 33, and a fourth color triangular sub-pixel unit 34, and the triangular sub-pixel units 31 32 33 34 are spliced to form the any one of the triangular pixel units 3. Wherein, the triangular pixel unit 3 shown in FIG. 4 is the face-up configuration.

Preferably, the first color triangular sub-pixel unit 31, the second color triangular sub-pixel unit 32, the third color triangular sub-pixel unit 33, and the fourth color triangular sub-pixel unit 34 have a same size, and the second color triangular sub-pixel unit 32 is disposed in a face-down configuration.

As shown in FIG. 4, in an embodiment of the present disclosure, a rectangular pixel unit 4 comprises a first color rectangular sub-pixel unit 41, a second color rectangular sub-pixel unit 42, a third color rectangular sub-pixel unit 43, and a fourth color rectangular sub-pixel unit 44, and the rectangular sub-pixel units 41 42 43 44 are spliced to form any one of the rectangular pixel units 4. Wherein, the rectangular pixel unit 4 shown in FIG. 4 is a face-up configuration. That is, the second color rectangular sub-pixel unit 42 is disposed under the first color rectangular sub-pixel unit 41, the third color rectangular sub-pixel unit 43, and the fourth color rectangular sub-pixel unit 44, and the rectangular pixel unit 4 formed by this arrangement is the face-up configuration.

Wherein, as shown in FIG. 3, the second pixel area may be formed by splicing the plurality of rectangular pixel units 4 arranged alternately in the face-up configuration and a face-down configuration. That is, disposing the second color rectangular sub-pixel unit 42 under the first color rectangular sub-pixel unit 41, the third color rectangular sub-pixel unit 43, and the fourth color rectangular sub-pixel unit 44, or on the first color rectangular sub-pixel unit 41, the third color rectangular sub-pixel unit 43, and the fourth color rectangular sub-pixel unit 44 alternately to form the second display area 2 having a rectangular shape.

It should be noted that only an arrangement containing three triangular pixel units 3 and an arrangement containing three rectangular pixel units 4 are shown in FIG. 2 and FIG. 3, but it can be adjusted according to sizes of pixel units and sizes of display areas. Therefore, the present disclosure is not limited to this.

The present disclosure splices the plurality of triangular pixel units 3 arranged alternately in a face-up configuration and a face-down configuration to form the first display area which includes the first boundary and has a shape consistent with a notch screen, thereby making the shape of the pixel units consistent with edges of the first display area and solving the problem of jagged edges.

Preferably, the first color rectangular sub-pixel unit 41, the second color rectangular sub-pixel unit 42, the third color rectangular sub-pixel unit 43, and the fourth color rectangular sub-pixel unit 44 have a same size.

Specifically, as shown in FIG. 4, a long side of the second color rectangular sub-pixel unit 42 is disposed adjacent to short sides of the first color rectangular sub-pixel unit 41, the third color rectangular sub-pixel unit 43, and the fourth color rectangular sub-pixel unit 44.

Specifically, the first color rectangular sub-pixel unit 41, the third color rectangular sub-pixel unit 43, and the fourth color rectangular sub-pixel unit 44 are arranged in sequence and adjacent to each other by a long side to a long side. A long side of the second color rectangular sub-pixel unit 42 is disposed adjacent to short sides of the first color rectangular sub-pixel unit 41, the third color rectangular sub-pixel unit 43, and the fourth color rectangular sub-pixel unit 44, and a length of the long side of the second color rectangular sub-pixel unit 42 is equal to the sum of lengths of the short sides of the first color rectangular sub-pixel unit 41, the third color rectangular sub-pixel unit 43, and the fourth color rectangular sub-pixel unit 44.

Preferably, the second color triangular sub-pixel unit 32 and the fourth color triangular sub-pixel unit 34 have a same luminescent color, and are blue triangular sub-pixel units, and the first color triangular sub-pixel unit 31 and the third color triangular sub-pixel unit 33 are respectively a red triangular sub-pixel unit and a green triangular sub-pixel unit. The embodiment makes the second color triangular sub-pixel unit 32 and the fourth color triangular sub-pixel unit 34 have a same luminescent color and be blue triangular sub-pixel units. That is, any one of the triangular pixel units 3 is provided with two blue triangular sub-pixel units, and the two adjacent blue triangular sub-pixel units in a triangular pixel unit are disposed in different rows of pixel units, thereby when driving a pixel circuit, within two adjacent frame times, the blue triangular sub-pixel units of the two adjacent rows can emit light alternatively, thereby extending the luminous life of blue pixels and improving display quality.

Preferably, the second color rectangular sub-pixel unit 42 and the fourth color rectangular sub-pixel unit 44 have a same luminescent color, and are blue rectangular sub-pixel units, and the first color rectangular sub-pixel unit 41 and the third color rectangular sub-pixel unit 43 are respectively a red rectangular sub-pixel unit and a green rectangular sub-pixel unit. The embodiment makes the second color rectangular sub-pixel unit 42 and the fourth color rectangular sub-pixel unit 44 have a same luminescent color and be blue rectangular sub-pixel units. That is, any one of the rectangular pixel units 4 is provided with two blue rectangular sub-pixel units, and the two adjacent blue rectangular sub-pixel units in a rectangular pixel unit are disposed in different rows of pixel units, thereby when driving a pixel circuit, within two adjacent frame times, the blue rectangular sub-pixel units of the two adjacent rows can emit light alternatively, thereby extending the luminous life of blue pixels and improving display quality.

That is, pixel units are in an RGBB arrangement. In organic light-emitting diodes (OLEDs), blue light-emitting materials have a shorter service life. Therefore, it can extend the life of blue sub-pixels by disposing two blue sub-pixels which could emit light alternatively within two adjacent frame times in a pixel.

In an embodiment of the present disclosure, wherein a luminescent color of the fourth color triangular sub-pixel unit 34 or the fourth color rectangular sub-pixel unit 44 is white; or a luminescent color of the second color triangular sub-pixel unit 32 or the second color rectangular sub-pixel unit 42 is white. That is, pixel units are in an RGBW arrangement, thereby improving the transmittance of the display screen.

It should be noted that one or more of the triangular pixel units 3 and the rectangular pixel units 4 may be in the RGBB or RGBW arrangements to adjust colors and transmittance.

The present disclosure further provides a display device which comprises the above special-shaped display screen.

The present disclosure provides a special-shaped display screen and a display device by respectively disposing pixel units having rectangular and triangular shapes with a same size in a first display area and a second display area to solve the problem of jagged edges. Further, the present disclosure could extend the life of blue sub-pixels in organic light-emitting diodes (OLEDs) or improve the transmittance of the display screen by comprising RGBB sub-pixels or RGBW sub-pixels in the pixel units, thereby improving display quality.

Although the present disclosure has been shown and described with respect to one or more embodiments, those skilled in the art will recognize equivalent variations and modifications upon reading and understanding the present specification and drawings. The present disclosure includes all such modifications and alterations, and is limited only by the scope of the appended claims. In particular, with regard to the various functions performed by the aforementioned components, the terminology used to describe such components is intended to correspond to any component (unless otherwise indicated) that performs the specified function of the component (eg, it is functionally equivalent), even if it is not structurally equivalent to the disclosed structure that performs the functions in the exemplary embodiments of the present disclosure shown herein. Furthermore, although a feature of the present disclosure has been disclosed with respect to only one of several embodiments, this feature may be combined with one or more other features in other embodiments that are desirable and advantageous for a given or specific application. Moreover, the terms "including", "having", "containing", or variations thereof are used in the detailed description or claims, such terms are intended to be included in a manner similar to the term "comprising".

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:
1. A special-shaped display screen, comprising:
a first display area including a first boundary and a first pixel area, wherein the first boundary is disposed on an outer periphery of the first pixel area; and
a second display area including a second boundary and a second pixel area, wherein the second boundary and the first boundary define an effective display area of the special-shaped display screen;
wherein the first pixel area is spliced by a plurality of triangular pixel units;
the second pixel area is spliced by a plurality of rectangular pixel units arranged alternately in a face-up configuration and a face-down configuration;
each of the rectangular pixel units comprises a first color rectangular sub-pixel unit, a second color rectangular sub-pixel unit, a third color rectangular sub-pixel unit, and a fourth color rectangular sub-pixel unit that have a same size and are spliced to form each of the rectangular pixel units; and a long side of the second color rectangular sub-pixel unit is disposed adjacent to short sides of the first color rectangular sub-pixel unit, the third color rectangular sub-pixel unit, and the fourth color rectangular sub-pixel unit.

2. The special-shaped display screen according to claim 1, wherein each of the triangular pixel units comprises a first color triangular sub-pixel unit, a second color triangular sub-pixel unit, a third color triangular sub-pixel unit, and a fourth color triangular sub-pixel unit, and the triangular sub-pixel units are spliced to form each of the triangular pixel units.

3. The special-shaped display screen according to claim 2, wherein the first color triangular sub-pixel unit, the second color triangular sub-pixel unit, the third color triangular sub-pixel unit, and the fourth color triangular sub-pixel unit have a same size, and the second color triangular sub-pixel unit is disposed in a face-down configuration.

4. The special-shaped display screen according to claim 3, wherein a luminescent color of the fourth color triangular sub-pixel unit is white.

5. The special-shaped display screen according to claim 2, wherein the second color triangular sub-pixel unit and the fourth color triangular sub-pixel unit have a same luminescent color, and are blue triangular sub-pixel units, and the first color triangular sub-pixel unit and the third color triangular sub-pixel unit are respectively a red triangular sub-pixel unit and a green triangular sub-pixel unit.

6. The special-shaped display screen according to claim 1, wherein the second color rectangular sub-pixel unit and the fourth color rectangular sub-pixel unit have a same luminescent color, and are blue rectangular sub-pixel units, and the first color rectangular sub-pixel unit and the third color rectangular sub-pixel unit are respectively a red rectangular sub-pixel unit and a green rectangular sub-pixel unit.

7. The special-shaped display screen according to claim 1, wherein a luminescent color of the fourth color rectangular sub-pixel unit is white.

8. A display device, comprising the special-shaped display screen according to claim 1.

9. A special-shaped display screen, comprising:
a first display area including a first boundary and a first pixel area, wherein the first boundary is disposed on an outer periphery of the first pixel area; and
a second display area including a second boundary and a second pixel area, wherein the second boundary and the first boundary define an effective display area of the special-shaped display screen;

wherein the first pixel area is spliced by a plurality of triangular pixel units arranged alternately in a face-up configuration and a face-down configuration;
the second pixel area is spliced by a plurality of rectangular pixel units arranged alternately in a face-up configuration and a face-down configuration;
each of the rectangular pixel units comprises a first color rectangular sub-pixel unit, a second color rectangular sub-pixel unit, a third color rectangular sub-pixel unit, and a fourth color rectangular sub-pixel unit that have a same size and are spliced to form each of the rectangular pixel units; and
a long side of the second color rectangular sub-pixel unit is disposed adjacent to short sides of the first color rectangular sub-pixel unit, the third color rectangular sub-pixel unit, and the fourth color rectangular sub-pixel unit.

10. The special-shaped display screen according to claim 9, wherein each of the triangular pixel units comprises a first color triangular sub-pixel unit, a second color triangular sub-pixel unit, a third color triangular sub-pixel unit, and a fourth color triangular sub-pixel unit, and the triangular sub-pixel units are spliced to form each of the triangular pixel units.

11. The special-shaped display screen according to claim 10, wherein the first color triangular sub-pixel unit, the second color triangular sub-pixel unit, the third color triangular sub-pixel unit, and the fourth color triangular sub-pixel unit have a same size, and the second color triangular sub-pixel unit is disposed in a face-down configuration.

12. The special-shaped display screen according to claim 10, wherein the second color triangular sub-pixel unit and the fourth color triangular sub-pixel unit have a same luminescent color, and are blue triangular sub-pixel units, and the first color triangular sub-pixel unit and the third color triangular sub-pixel unit are respectively a red triangular sub-pixel unit and a green triangular sub-pixel unit.

13. The special-shaped display screen according to claim 9, wherein the second color rectangular sub-pixel unit and the fourth color rectangular sub-pixel unit have a same luminescent color, and are blue rectangular sub-pixel units, and the first color rectangular sub-pixel unit and the third color rectangular sub-pixel unit are respectively a red rectangular sub-pixel unit and a green rectangular sub-pixel unit.

14. The special-shaped display screen according to claim 9, wherein a luminescent color of the fourth color triangular sub-pixel unit or the fourth color rectangular sub-pixel unit is white.

* * * * *